United States Patent

An

[11] Patent Number: 5,920,227
[45] Date of Patent: Jul. 6, 1999

[54] ZERO CURRENT DRAW CIRCUIT FOR USE DURING A BONDING OPTION

[75] Inventor: Jiu An, San Jose, Calif.

[73] Assignee: Advanced Micro Devices, Inc., Sunnyvale, Calif.

[21] Appl. No.: 08/876,213

[22] Filed: Jun. 16, 1997

[51] Int. Cl.[6] .................................................... G05F 3/02
[52] U.S. Cl. ............................ 327/544; 327/387; 326/38
[58] Field of Search ................................... 327/427, 434, 327/544, 387, 388; 326/30, 38

[56] References Cited

U.S. PATENT DOCUMENTS 4,490,634  12/1984  Hareyama ................................. 327/388
5,412,333  5/1995   Okunaga .................................. 327/391
5,420,526  5/1995   Fensch .................................... 327/321

FOREIGN PATENT DOCUMENTS 5-62465  3/1993  Japan .

Primary Examiner—Kenneth B. Wells
Attorney, Agent, or Firm—Fliesler, Dubb, Meyer & Lovejoy

[57] ABSTRACT

A circuit that is coupled to a bonding pad of an integrated circuit structure for reducing the leakage current through the structure to approximately zero when a bonding option is selected. The current path through the integrated circuit structure is removed by turning off a circuit element upon application of a control signal from the integrated circuit structure.

8 Claims, 4 Drawing Sheets

ZERO CURRENT DRAW CIRCUIT FOR USE DURING A BONDING OPTION

FIELD OF INVENTION

The present invention generally relates to integrated circuits and, more particularly, to a circuit for providing substantially zero leakage current during a bonding option.

BACKGROUND OF THE INVENTION

In integrated circuits (ICs), the internal circuitry which provides the functionality of the IC is coupled to the leads of a chip package through the use of bonding pads. In many instances, the bonding pads have associated circuitry coupled thereto to transfer the signal present on the bonding pad to the internal circuitry. In the IC industry, a bonding option is frequently used to provide a family of devices (a number of different devices) using a single die.

In a standard Complementary Metal Oxide Semiconductor (CMOS) design, the bonding option is commonly achieved by connecting a bonding pad to an adjacent $V_{cc}$ (or $V_{ss}$) pad with a bonding wire. Since the bonding pad is usually connected to the gate of an input buffer, it has to be pulled to $V_{ss}$ (or $V_{cc}$) through a resistor or a transistor in silicon in a default configuration.

In the default configuration, a bonding pad is generally tied to $V_{ss}$ through a transistor thereby providing a logical zero signal to the internal circuitry. In an alternate configuration (bonding option), the bonding pad is bonded to a neighboring $V_{cc}$ pad, thereby providing a logical high signal to the internal circuitry. By using the bonding option approach, a single IC design can perform multiple functions. If the bonding pad is connected to $V_{ss}$, a logic zero is passed to the internal circuitry resulting in the internal circuitry performing a first function. If the bonding pad is connected to $V_{cc}$, a logic one is passed to the internal circuitry resulting in the internal circuitry performing a second, or alternate, function. Every bonding pad connected to the IC structure can be bonded in the fashion described above. Thus, through the use of a bonding option, a family of devices using a single die can be provided.

A Problem with the bonding option approach discussed above is that a leakage current flowing from $V_{cc}$ through the bonding wire and the transistor connected to the bonding pad to ground is present. The amount of leakage current is dependent upon the size of the transistor and process variations. In most applications, the leakage current is in the range of several hundred microamps. In devices such as pacemakers, laptop computers and Personal Digital Assistants (PDA's) which run on battery power, a constant leakage current of such magnitude may cause the device to malfunction or at a minimum reduce battery life.

SUMMARY OF THE INVENTION

The aforementioned and related drawbacks associated with leakage current resulting from an integrated circuit being in a bonding option is overcome by the present invention. The present invention is directed to a zero current draw circuit which is connected between the bonding pad of an integrated circuit and the internal circuitry of the integrated circuit. In a first configuration (referred to as the default configuration), no leakage current is drawn because the bonding pad is pulled to ground potential through a pull-down transistor which is turned on in the default configuration.

In an alternate configuration (referred to as a bonding option configuration) the bonding pad is forced to $V_{cc}$ which in turn provides a logical high signal to the internal circuitry. The pull-down transistor, which provides a current path between the bonding pad and ground potential, is turned off by application of a signal from circuitry within the zero current draw circuit to thereby remove the current path to ground potential. By removing the current path, the leakage current through the bonding wire is reduced to approximately zero.

In an exemplary embodiment of the present invention, the zero current draw circuit includes an input for receiving a first signal; an output for delivering the first signal; a transistor, coupled to the input, for selectively providing a current path for the first signal in response to a second signal and circuitry, coupled between the transistor and the output, for providing the second signal.

An advantage of the present invention is the ability to reduce the leakage current present in integrated circuit devices.

Another advantage of the present invention is the ability to increase effective battery life.

Still another advantage of the present invention is that it provides an effective way to provide multiple products from a single device or design.

Yet another advantage of the present invention is that it reduces manufacturing costs.

Still yet another advantage of the present invention is that it eases inventory control.

BRIEF DESCRIPTION OF THE DRAWINGS

These and other advantages of the present invention will become apparent from the following description of the embodiments, taken in conjunction with the accompanying drawings, where like numerals represent like elements, in which.

DESCRIPTION OF THE EMBODIMENTS

The present invention relates to a zero current draw circuit coupled to a bonding pad of an integrated circuit structure which provides a current path between the bonding pad and ground potential during normal operating modes. The zero current draw circuit also has the ability to remove the current path between the bonding pad and ground potential when the integrated circuit is in an alternate operating mode. The structure and operation of the zero current draw circuit will now be described with reference to FIGS. 1 and 3–6.

Figure 1:
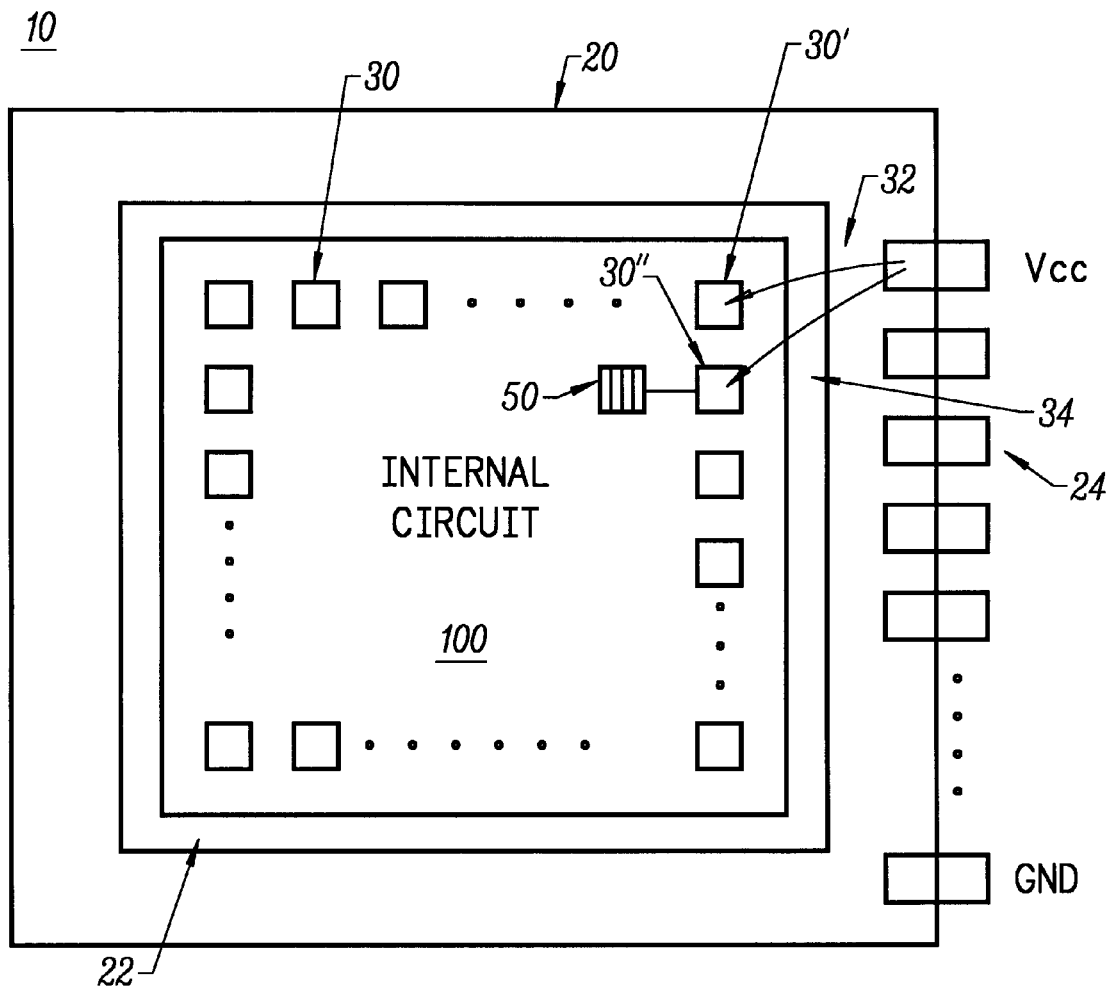
FIG. 1 presents a top view of an integrated circuit (silicon die and package) including the zero current draw circuit of the present invention.

FIG. 1 presents a top view of an integrated circuit and package incorporating the zero current draw circuit of the present invention. The integrated circuit 10 includes a chip package 20 having a cavity 22 for housing internal circuitry 100. Package leads 24 for connecting the internal circuit 100 to outside devices are provided along the periphery of chip package 20. Bonding pads 30 are used to connect the internal circuitry 100 to the package leads 24. Coupled between the bonding pads 30 and the internal circuitry 100 is the zero current draw circuit 50 of the present invention.

During operation of the integrated circuit 10, signals are provided to the package leads 24 which, in turn, are provided to the internal circuitry 100 through the bonding pads 30. Depending upon the signals present on the package leads 24, the internal circuitry 100 performs various functions. The bonding pad 30' (or power supply pad) is connected to a $V_{cc}$ pin via line 32. In a first mode of operation (or default mode), the adjacent bonding pad 30" is not connected to any package leads. With this configuration, the internal circuitry 100 performs a first function. In an alternate mode of operation (bonding option mode), the adjacent bonding pad 30" (or bonding option pad) is bonded to the $V_{cc}$ pin through a bonding wire 34. With this configuration the internal circuitry 100 performs a second or alternate function.

In the first mode of operation, the bonding option pad 30" is initially not connected to any package leads. In the bonding option mode, the bonding option pad 30" is connected to $V_{cc}$ which causes the internal circuitry to perform an alternate function. In a preferred embodiment, the bonding wires cannot be crossed. Thus, the bonding option pad is always the bonding pad adjacent to the power supply pad. For the integrated circuit present in FIG. 1, the power supply pad would be the pad 30' coupled to $V_{cc}$. The operation of the zero current draw circuit 50 will be described in greater detail below.

Figure 2:
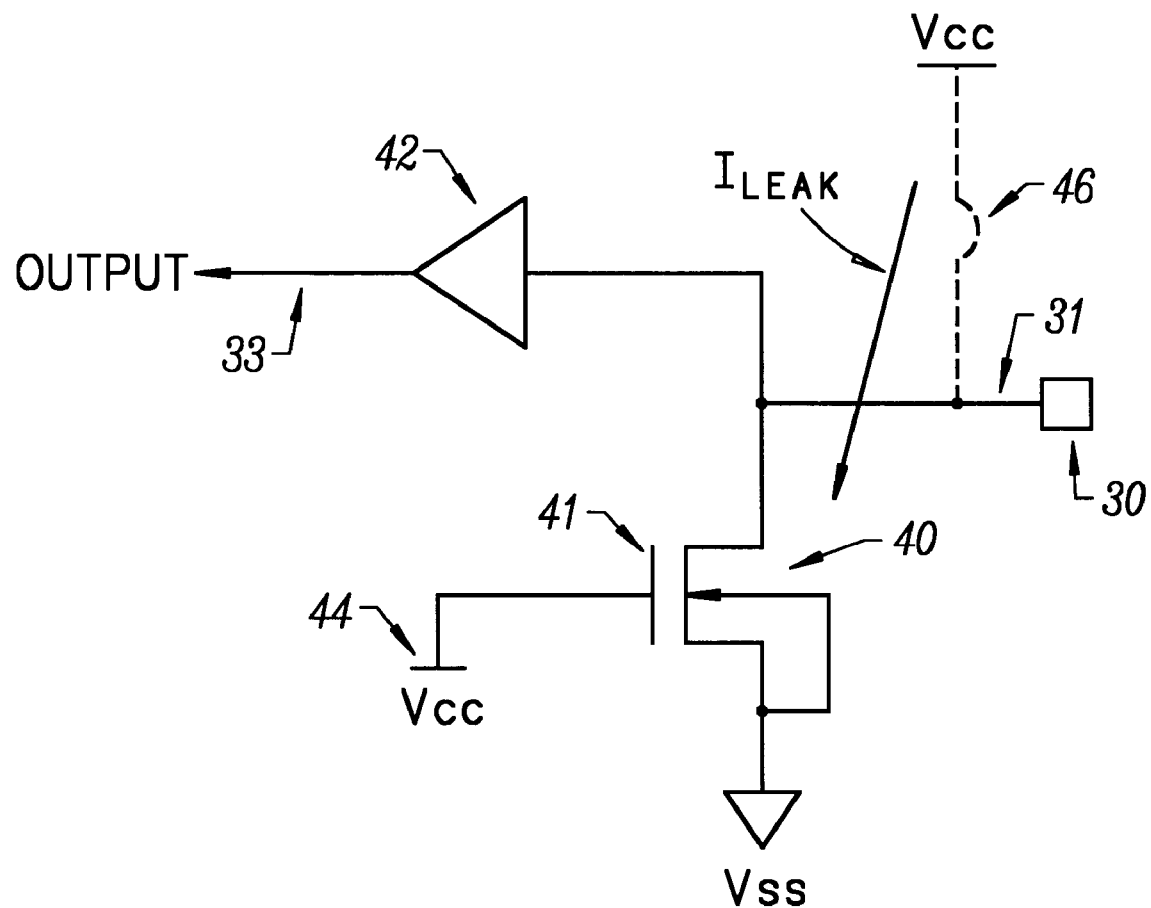
FIG. 2 presents a schematic top view of a conventional bonding option circuit.

FIG. 2 presents a schematic top view of a conventional bonding option circuit. The signal present on the bonding pad 30 is transmitted on line 31 to the input of a buffer 42. The output of the buffer 42 provides the input to the internal circuitry (not shown) on line 33. The signal on line 31 is also provided to the drain of an n-type transistor 40 having a control gate 41 coupled to $V_{cc}$ via line 44. The source of the transistor 40 is coupled to $V_{ss}$, which is held at ground potential.

During the default mode of operation, there is no leakage current through the bonding pad because the voltage potential at the bonding pad is pulled to $V_{ss}$ through the transistor 40 which is always on.

During a bonding option mode of operation, the bonding pad is coupled to $V_{cc}$ via bonding wire 46, (shown as a dotted line) which forces the signal present on line 31 to $V_{cc}$. This signal is then provided to the input of the buffer 42 and subsequently to the input of the internal circuitry via line 33. However, a leakage current ($I_{LEAK}$) as illustrated by the arrow will be present on the bonding wire 46 because the transistor 40 remains in the on state because the control gate 41 of the transistor is connected to $V_{cc}$ via line 44.

A drawback with this type of bonding option circuit is that there is always a leakage current being transmitted through the bonding wire because the transistor 40 is always on. In most applications, the leakage current produced by the bonding option circuit shown in FIG. 2 is in the range of several hundred microamps, which is a small percentage of the total current drawn in most applications. However, in low current draw applications such as pacemakers or battery operated devices such as laptop computers or PDA's, the constant leakage current decreases the effective battery life of the device and/or may cause device failure.

Figure 3:
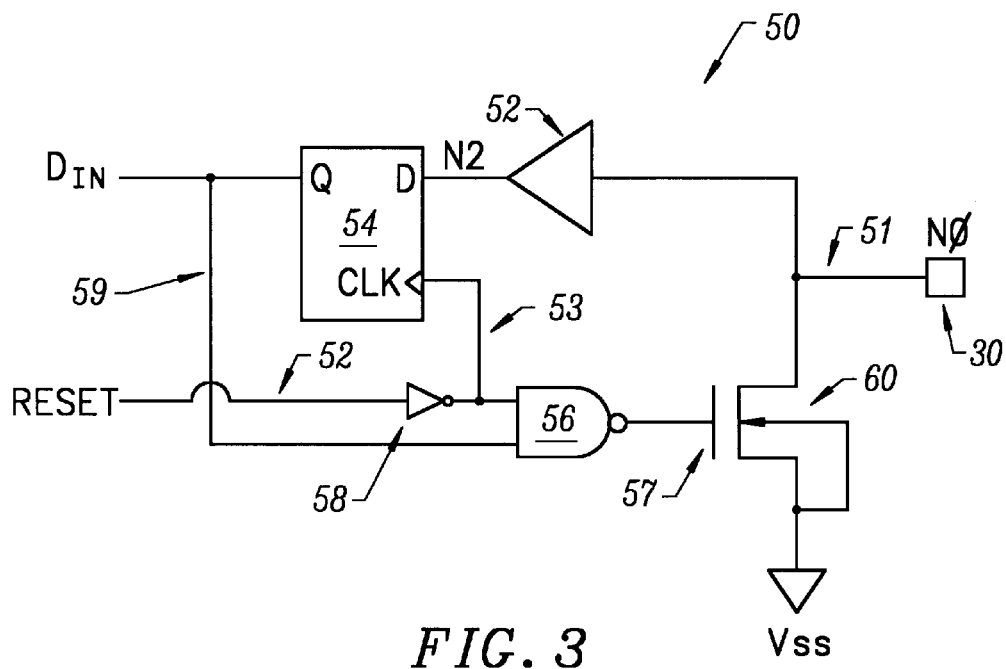
FIG. 3 presents a schematic top view of the zero current draw circuit of the present invention in a first configuration.

FIG. 3 presents a schematic top view of the zero current draw circuit of the present invention in the default mode. A bonding pad 30 carries a signal, N0, to the input of a buffer 52 on line 51. The output of the buffer 52 is provided as an input (D) of a D flip flop 54 on line N2. The output (Q) of the D flip flop 54 is provided as the input signal $D_{IN}$ to the internal circuitry (not shown) on line 59. A clock signal is provided to the CLK input of the D flip flop 54 by the output of an inverter 58 on line 53. The input of the inverter is connected to a RESET signal provided by the internal circuitry (not shown) on line 52. The bonding pad 30 is also coupled to the drain of an n-channel pull-down transistor 60. The source of the n-channel pull-down transistor 60 is coupled to $V_{ss}$, which is held at ground potential. The control gate 57 of the n-channel pull-down transistor is coupled to line N1. The n-channel pull-down transistor 60 provides a current path between the bonding pad and ground. The output of the inverter 58 is also provided as a first input to a NAND gate 56. The second input to the NAND gate 56 is the $D_{IN}$ signal provided by the D flip flop 54 on line 59. The output of the NAND gate is present on line N1.

Figure 4:
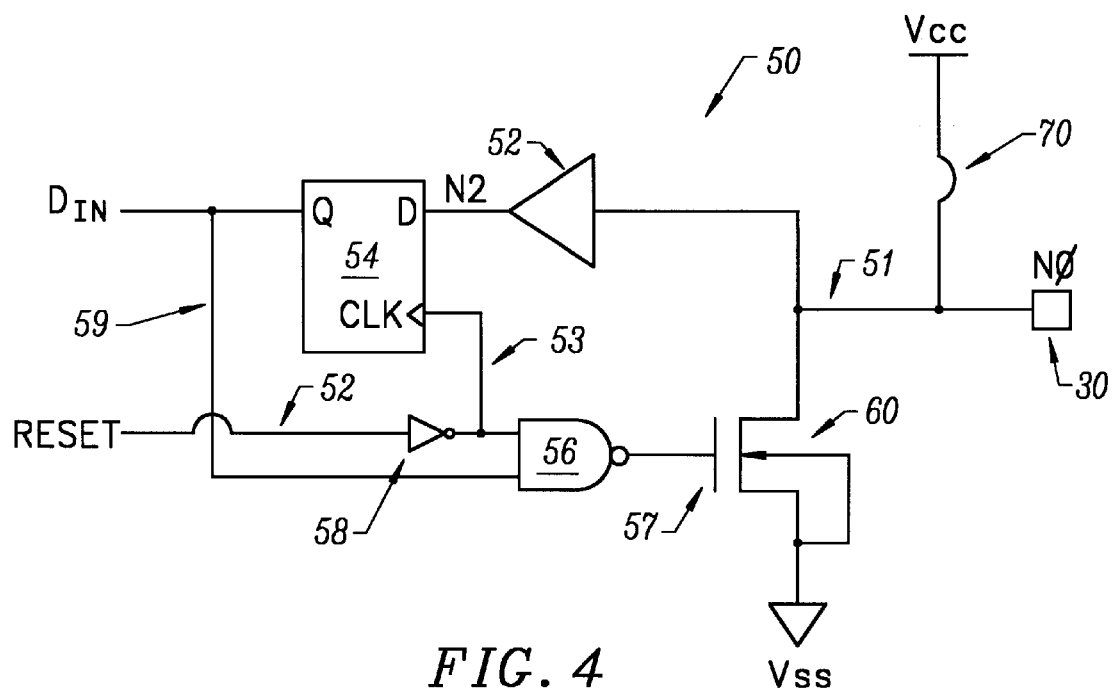
FIG. 4 presents a schematic top view of the zero current draw circuit of the present invention in a second configuration.

FIG. 4 presents a schematic top view of the zero current draw circuit when in the bonding option. The difference between the circuit presented in FIG. 4 and the circuit presented in FIG. 3 is that the bonding pad 30 is coupled to a voltage source $V_{cc}$ through a bonding wire 70. In this configuration the bonding pad 30 is pulled to a logic one (high). Thus, the signal on line N2 is also high.

Figure 5:
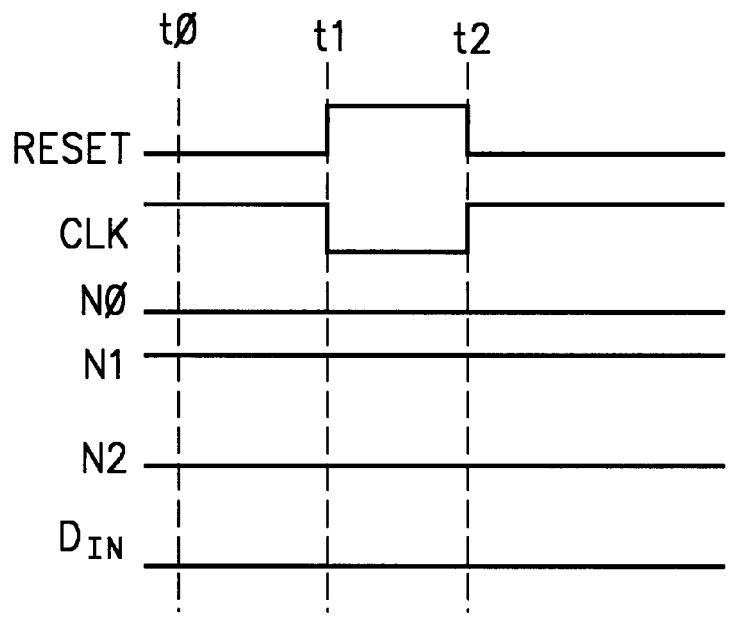
FIGS. 5 and 6 present timing diagrams illustrating the operation of the zero current draw circuit of the present invention.

The operation of the zero current draw circuit will now be described with reference to FIGS. 5–6. FIG. 5 presents a timing diagram illustrating the operation of the zero current draw circuit in a default (non-bonding option) operating mode. After time T1, the RESET signal is asserted which causes the CLK signal to switch from high to low. The logic signal on line 53 (CLK) is passed to the first input of the NAND gate 56, resulting in the signal present on line N1 being high. The signal N0 is pulled to low (logic zero) through the n-channel pull-down transistor 60 which is on while N1 is high. This logic zero signal is passed through the buffer to the input of the D flip flop 54 on line N2. Thus, N2 is low.

At time T2, the RESET signal is deasserted which causes the CLK signal to switch from low to high. The rising edge of the CLK signal enables the D flip flop 54 to pass the signal from line N2, which is low, to $D_{IN}$. Thus, $D_{IN}$ stays low after time T2. Since the signal on line 59 is low the pull-down transistor remains on, which keeps the signal N0 at ground potential after time T2.

As shown in FIG. 5, the signal on N0 is always low, thus no current is drawn through the n-channel pull-down transistor.

Figure 6:
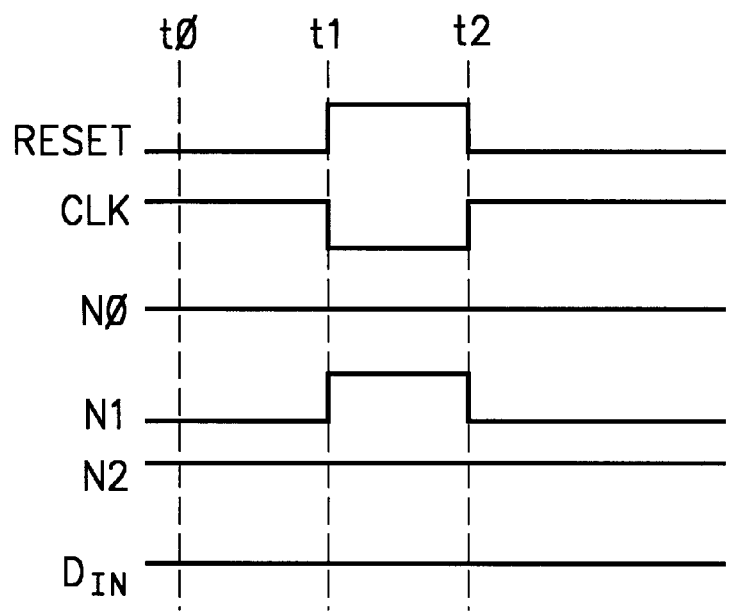

FIG. 6 presents a timing diagram illustrating the operation of the zero current draw circuit when in the bonding option operating mode.

Since the bonding pad 30 is wire bonded to $V_{cc}$, the signal on line 51 is always high regardless the status (on or off) of the n-channel pull-down transistor 60. Thus, the signal on line N2 remains high.

After time T1, the RESET signal is asserted which makes the CLK signal switch from high to low. The logic zero signal on line 53 is present as an input to the NAND gate 56, resulting in line N1 switching from low to high, which turns on the n-channel pull-down transistor 60. A leakage current (in the range of a few hundred microamps) is drawn from $V_{cc}$ to $V_{ss}$ through the n-channel pull-down transistor 60 during the period of the RESET signal being high which, in a preferred embodiment, lasts about one millisecond.

At time T2, the RESET signal is deasserted which causes the CLK signal to switch from low to high. The rising edge of the CLK signal enables the D flip flop 54 to pass the signal present on line N2, which is high, to $D_{IN}$. The signal $D_{IN}$ stays high after time T2. The signal on line 53 is high after T2 due to deassertion of RESET. The n-channel pull-down transistor 60 is turned off because the output of the NAND gate on line N1 switches from high to low after the deassertion of the RESET signal. Therefore, the leakage current flow from $V_{cc}$ to $V_{ss}$ through the pull-down transistor 60 is cut to approximately zero.

The foregoing description of the embodiments has been presented for the purposes of illustration and description. It is not intended to be exhaustive or to limit the invention to the exact form disclosed, and obviously, modifications and variations of the invention are possible in light of the above teaching. The zero current draw circuit for use during a bonding option was described in order to best explain the principles of the invention and its practical application to thereby enable others skilled in the art to best utilize the invention in various embodiments and with the various modifications as are suited to their particular use contemplated. It is intended that the scope of the invention be defined by the claims appended hereto.

What is claimed is:

1. A circuit, comprising:

an input for receiving a first signal;

an output for delivering said first signal; and a switching circuit coupled between said input and said output, said switching circuit including means for generating a second signal, said switching circuit providing a current oath for said first signal, wherein upon application of said second signal, said first signal is provided along said current path;

wherein said means for generating said second signal comprises a register coupled to said input; an inverter; and a logic element, said register operative to deliver a delayed version of said first signal upon application of said second signal.

2. The circuit of claim 1, wherein said register is a flip flop.

3. The circuit of claim 2, wherein said flip flop is a delay flip flop.

4. The circuit of claim 3, wherein said logic element is a NAND gate.

5. A zero-current draw circuit comprising:

an input for receiving a first signal;

an output for delivering said first signal;

a transistor, coupled to said input, selectively providing a current path responsive to a second signal; and circuitry, coupled between said transistor and said output, providing said second signal;

wherein said circuitry comprises a delay element coupled to said input; an inverter; and a logic gate, said delay element operative to deliver a time shifted version of said first signal.

6. The zero current draw circuit of claim 5, wherein said delay element is a D flip flop.

7. The zero current draw circuit of claim 5, wherein said delay element is a delay flip flop.

8. The zero current draw circuit of claim 5, wherein said logic gate is a NAND gate.

* * * * *

UNITED STATES PATENT AND TRADEMARK OFFICE
CERTIFICATE OF CORRECTION

PATENT NO. : 5,920,227
DATED : July 6, 1999
INVENTOR(S) : Jiu An

It is certified that error appears in the above-indentified patent and that said Letters Patent is hereby corrected as shown below:

Column 5, line 31, "oath" should be -- path --;

Column 6, line 11, "claim 3" should be -- claim 1 --.

Signed and Sealed this

Twenty-fourth Day of October, 2000

Attest:

Q. TODD DICKINSON

*Attesting Officer*     *Director of Patents and Trademarks*